United States Patent Office 3,152,097

Patented Oct. 6, 1964

3,152,097

RESIST COMPOSITION OF POLYISOBUTYLENE, POLYETHYLENE AND POLYMERIZED CYCLOPENTADIENE DIMER IN HYDROCARBON SOLVENT

Jean Durand, St.-Mande, France, assignor to International Business Machines Corporation, New York, N.Y., a corporation of New York No Drawing. Filed July 9, 1962, Ser. No. 208,564
5 Claims. (Cl. 260—33.6)

This invention relates to a chemically-resistant protective masking non-conductive and non-porous resist composition especially useful for masking selected portions of metal surfaces immersed in highly corrosive oxiding acid or alkaline liquid baths for the purpose of selectively modifying by electroplating, chemical etching, chemical milling and the like unmasked metal areas immersed in said corrosive baths while completely stopping off those areas which are masked from any unwanted oxidizing or etching action despite both the length of time which is necessary for the desired etching, oxidizing and/or electroplating operations and the severely corrosive nature of the strong and highly oxidizing acid baths which are needed for the desired surface modification.

Heretofore, protective acid-resistant coating compositions based upon varnish, bitumen or asphalt have been widely used in etching, anodizing and electroplating operations for the purpose of masking metal areas from unwanted chemical or electroplating action. A typical example of the acid-resistant coating used in the prior art is found in the early U.S. Patent, No. 89,522 to Hiram Tucker of Newton Mass., dated April 27, 1869. This inventor recognized that an economical process for electroplating oxidizable metal bases, such as iron or copper, required the use of a masking material to protect the metal base from oxidation; and he suggested a thin coating of hard varnish for electrodeposition of nickel and gold. The resist was applied by ordinary varnish applying techniques and, for the inventor's purposes, was sufficiently tenacious to withstand the risk of accidental removal by the action of the solutions used in the electrodeposition process.

This same type of resist as suggested by Tucker is used today in the manufacture of printed wiring circuits of the etched-foil type, as is disclosed in U.S. Patent to Bain and Geshner, No. 2,861,029, dated November 11, 1958, who disclose a resist compound of approximately 70% phenolic resin, 2% carbon black, 1% rosin oil, and 27% tung oil.

The etched-foil printed wiring circuit disclosed in the aforesaid Bain et al. patent is made by placing sheets of copper on opposite sides of an uncured buildup of phenol-fiber and then pressing the copper sheets tightly against the phenol-fiber to compress into a board which is cured to bond the copper to the phenol-fiber board. The boards are offset printed with resist to leave only the terminal portions exposed to the etching powder which is applied to the resist and backed, thereby gold plating the terminal portions. An acid bath dissolves the rest of the resist from the copper sheets and the sheets are then printed by offset printing with a resist to form a predetermined pattern on the sheets, etching powder is applied to the resist and baked, and the uncovered portions of the copper sheet are etched away, after which the resist is removed and a protective coating layer is applied to the boards.

The lacquer resists which are taught in the aforementioned prior art patents of Tucker and Bain et al represent only one type of present commercial practice in the printed circuit field and other lacquers have been suggested, such as that based upon pitch in Hennegan patent, No. 2,006,553, granted July 2, 1935, that based upon alkyd resin in this same Hennegan patent as an improvement over pitch and varnish urea formaldehyde resin lacquer shown in Sommers patent, No. 2,258,520, dated October 7, 1941, nitrocellulose lacquer as shown in Soderberg patent, No. 1,794,929, granted March 3, 1931, vinyl lacquer in Gaynes patent, No. 2,999,771, dated September 12, 1961, as well as in Hampson patent, No. 2,372,488, dated July 20, 1942, and in Newman patent, No. 2,762,694, dated September 11, 1956.

The multiplicity of prior art suggestions for selecting the newer synthetic resins which are available as the lacquer material illustrates the dissatisfaction with the present resist compositions, a dissatisfaction which can perhaps be better understood in the light of the more severe performance requirements which modern etching and plating technology imposes upon the resist material.

These requirements are well-stated in the forementioned patents to Gaynes and Newman. These patentees state that the synthetic resins of the prior art must be of a specific type for acid resistance and of a different type for alkali resistance, that the coatings tend to be porous and become brittle after long immersion in the corrosive bath, and that the coatings tend to flake and thereby permit corrosive action in unwanted areas. The coating technology suggested by these patentees has become more complicated rather than less complicated; Gaynes mixes certain special modified vinyl polymers with stabilizer and special plasticizer in order to achieve the desired chemical resistance of the resist material, while Neuman must use an acid wash-coat of special composition to protect the underlying aluminum base and to secure adherence to the vinyl organosol resist which is employed. In balance, the basic method of Tucker's patent of nearly 100 years appears to be as feasible in practice as the more complicated methods employing vinyl resin. The defects of the lacquer resist and of the asphalt or bitumen resist still remain and do not appear to be solved by the new synthetic materials which are heretofore proposed. The simplicity of easy removal of the resist by solvent treatment, which represents one of the most important advantages of the bitumen resist, is far outweighed by the greater difficulty for solvent removal by turning to the more highly adherent vinyl resins.

The present invention provides a protective masking resist composed entirely of hydrocarbon resinous materials and uniquely adapted for easy solvent removal, yet formulated to provide excellent adherence to the metal surface which is to be protected without requiring special primers or expensive solvents, either for application to the base or for removal after electroplating and/or etching.

More particularly, the chemically resistant protective masking resist composition of the present invention comprises a mixture of (1) a minor proportion of polymerized isobutylene modified with (2) a minor proportion of low molecular weight polyethylene, the low molecular weight polyethylene being present in an amount to reduce both the excessive tackiness and solvent retention characteristics of the polyisobutylene, and (3) a major proportion of high melting polymerized cyclopentadiene dimer which functions as a hardening agent to prevent unwanted flow of the coating and which further prevents undue shrinkage of the coating deposited from medium to high boiling solvents.

It is an advantage in using the new composition of the invention that the volatile solvent employed to disperse the resinous ingredients be a hydrocarbon solvent which is of the medium to heavy aromatic type, e.g., it contains a substantial proportion of high-flash naphtha or refined naphtha having a distillation range of between about 148° C. and 190° C. and preferably with a substantial proportion, e.g., about 30% to 40% distilling below 160° C.

If a light grade solvent naphtha is employed, there is a tendency for the polyisobutylene component to become excessively tacky by virtue of high solvent retention and more important, the volatility is such that the coating provides hard and soft areas which render the control of desired film weight difficult. Toluene or benzene, which have high solvency characteristics for all of the ingredients, are generally too volatile when used as solvents and better physical control of the coating in terms of uniformity, coating thickness and homogeneity of the film result when the high aromatic solvents of higher boiling point range are employed. It is possible to utilize only limited quantities of the lower aromatic solvents, e.g., no more than about 5% to 8% by volume in the heavy aromatic solvents without encountering the defects due to the excessive rate of evaporation, but no economic advantage results from such dilution.

The heavy aromatic solvents which may be used in accordance with the invention are commercially available under such trade names as Solvesso 150, White Spirits, High-Flash Naphtha, Semi-Refined Naphtha and Refined Naphtha. Generally, these solvent naphthas are mixtures composed of one or more of coumarone, indene, naphthalene, methylnaphthalene, xylenes, cumene, polyalkyl benzenes and the like depending upon whether they are derived from coal tar or from petroleum sources. The petroleum-based products are generally higher in xylenes, polyalkylated benzenes and cumene content while the coal tar product is higher in its naphthalene and coumarone content. Obviously, any of the components of the commercial naphthas may be used in pure form if the occasion arises and these pure solvents are available without in any way altering the desirable coating results which are achieved in accordance with the invention.

The amount of solvent which is employed is such as to provide the desired coating weight and to eliminate as far as possible, any problems of solvent recovery or any hazard to the operator. Since it is relatively easy to prepare solutions containing about 50% to 55% of total resin solids and thereby coat the underlying metal in a thickness of 2 to 3 mils by single spraying, brushing or roller coating operation, it is this rather high solids solution which is preferred in practice. As is well known, the proportions of the resin may be reduced to as little as about 5% by merely adding more solvent or the resin solids can be adjusted in any intermediate range between 5% resin solids and 55% resin solids whereby any predetermined coating rate between about 0.03 and up to about 0.3 milligram of dry coating per square centimeter may be applied, the adhesion of the coating to the underlying base metal being outstanding regardless of the coating weight which is applied.

The proportions of (1) polymerized isobutylene, (2) low molecular weight polyethylene, and (3) cyclodiene vary between very narrowly defined ranges as shown in Table 1 below, these proportions being critical in order to achieve the results intended for protective acid and alkali-resistant coating in the various electrolytic treatments of the supporting underlying base metal which are required to produce the etched product.

In Table 1 below the range of the proportions of the resinous ingredients and the preferred proportions are listed in gram weights and the volume of solvent is shown in cubic centimeters.

TABLE 1

*Illustrative Proportions of Resinous Ingredients and Solvent Carrier*

| Component | Low Tack | High Tack | Preferred |
|---|---|---|---|
| Solvent (such as "Solvesso 150" "White Spirit", etc.). | 800 cc. | 1,100 cc. | 950 cc. |
| Isobutylene "Oppanol B 50". | About 20 grams. | 500 grams | 100 grams. |
| Polyethylene "Polyethylene $AC_8$". | About 50 grams. | 300 grams | 200 grams. |
| Cyclodiene Resin "Escorez 1102 B". | About 100 grams. | 1,000 grams | 400–420 grams. |
| Pigment or Colorant | 1 percent of resin solids. | 5 percent of resin solids. | 3 percent of resin solids (20 grams). |

The above film resin proportions after the solvent has evaporated based on weight percentage of ingredient is given below:

| Component | Low Tack, percent | High Tack, percent | Preferred |
|---|---|---|---|
| Isobutylene | 11 | 28 | 21–12 |
| Polyethylene | 29 | 17 | 24–28 |
| Cyclodiene Dimer Resin Polymerized Friedel-Crafts | 60 | 55 | 55–60 |

Valuable novel chemically resistant resinous compositions in accordance with the invention are generally achieved as long as the proportion of the cyclopentadiene dimer polymerized to softening point of 95° C. or higher by Friedel-Crafts is present in an amount of greater than 50% and less than 65% with at least 10% of polyisobutylene and at least 15% polyethylene of low to medium molecular weight also being present. The molecular weight of the polyethylene may vary from about 3500 to about 22,000, the preferred value being between about 6000 and 14,000, so that in the amounts used, e.g., 15–40% by weight of the total resin, tack is reduced and better flow properties are obtained.

In its broadest aspects the composition contains 50–65% cyclopentadiene polymer, 10–35% polyisobutylene and 15–40% of polyethylene, the best balance of properties for desirable flow characteristics to make application most practical by coating, molding and extrusion methods being at 55–60% of cyclodiene polymer, 12–24% of isobutylene polymer and 19–33% of polyethylene.

"Escorez 1102 B" used herein is a thermoplastic hard hydrocarbon resin softening in the range of 95–105° C. and is formed by polymerizing cyclopentadiene dimers and codimers of cyclopentadiene and alkyl cyclopentadienes; for example, with Friedel-Crafts type catalysts, boron trifluoride or aluminum chloride at temperatures between 35° and 95° F., and at a contact time ranging from about 5 minutes up to 10 hours, the time and temperature being regulated to give the desired melting point of the product, depending upon the ratio of dimer, codimer and cyclopentadiene monomer in the feed. There is used between 1% and 5% of Friedel-Crafts catalyst which in the preferred case is boron trifluoride at 1% concentration. The catalytic polymerization is carried out in the lower part of the temperature range to give hard, high-melting polymers having a softening point above 95° C. The unpolymerized materials present in the product is readily extracted with solvent to recover hard resin product of the desired softening point.

The above "Escorez" resin is described in U.S. Patent 2,963,456, issued December 6, 1960; and this patent describes the production of binders for sand cores, there being used a polymerized mixture of linseed oil and the above described polymer in Varsol solvent as the binder for sand. The process described in the examples of this patent can make a product which varies in physical state from a semi-solid polymer slushy at room temperature up to a hard, high-melting polymer which has a softening point of about 212° F. It is only the high-melting polymer which represents "Escorez 1102 B."

Due to the fact that the polymer is made by first thermally treating a specific cyclopentadiene fraction from steam-cracking of petroleum fraction boiling between 80° and 350° F., e.g., heat soaking the steam-cracked fraction at 220°–240° F. to dimerize the cyclic dienes, and then polymerizing in the presence of Friedel-Crafts type catalyst, it is clear that the present dimer polymer is unique. It requires two steps of polymerization, first a non-catalytic heating step to a dimer and then a Friedel-Crafts polymerization to bring the molecular weight of the dimer up to values possessing the 100° C. softening point.

Friedel-Crafts polymerization is distinct from ordinary free radical polymerization (peroxide catalyst) in proceeding via a cationic mechanism which generally requires lower temperature for polymerization and generally gives low molecular weight products.

Initiation of the polymerization involves the formation of a complex between the electron-rich double bond component and the electron-accepting catalyst, propagation of the chain providing a substantial number of side chains at the tertiary carbon atom which represents the site of chain growth and chain termination so that the products which result are highly branched carbon chains. The two structural features which are unusual in the present polymer are the cyclic rings of cyclopentadiene dimer which lie on opposite sides of the linear hydrocarbon chain and which have practically no unsaturation, as evidenced by a very low or substantially zero iodine number.

This polymer is different in its structure and its molecular weight, e.g., chain length, from cyclopentadiene homopolymer, which is referred to in Schildknecht "Polymer Processes," vol. X, Interscience Publishers, 1956, page 219. Starting with the dimer or codimer provides a different branching on the linear chain in the present case, as pointed out above, than would be achieved if cyclopentadiene monomer were to be treated with the same catalyst with the production of low polymers in liquid form rather than in solid form. A major factor in achieving high softening point is undoubtedly the result of the cyclic structure of the codimer prepared in the first step of the unique method for producing the present resin.

There is little probability of the codimer polymerization occurring without first isolating the codimer since the codimer made thermally retains a double bond linkage, while the codimer made by cationic mechanism loses the double bond linkage.

It will be appreciated that the foregoing lengthy explanation to illuminate the structural uniqueness of the present material is sufficiently specified by pointing out how the resin is made.

The last step is the process of recovering the resin which is to extract the low-melting fractions with solvent, e.g., with linear hydrocarbon solvents such as pentane or hexane or with mononuclear hydrocarbon solvents, cyclohexane, benzene or toluene, these solvents removing the softer lower melting fractions by dissolution and leaving the harder, higher-melting material behind in solid phase.

Crystallization or recrystallization can be effected from polynuclear hydrocarbons or mixtures of polynuclear and mononuclear hydrocarbons following standard purification procedures.

The products represented by Table 1 herein may be used in the form of a coating which after the solvent has evaporated, displays outstanding physical and chemical resistance for any substrate upon which it is placed, or may be used in powder form to make molded articles.

Any of the ingredients of the mixture taken separately would not have the utility of the specified mixture. The present mixture has utility in slush molding. The product is so attractive economically and so obviously useful in resin technology because of its superior physical and chemically inert properties that it has value far beyond the present treatment of metal by masking.

The isobutylene resin which is employed is a high molecular weight polymer which is present in a minor amount, e.g., 10–35% by weight of the total resin and is made by ionic polymerization of low temperature using Friedel-Crafts type of catalyst (boron trifluoride) and its preparation is shown in U.S. Patent Nos. 2,317,878 and 2,311,567, the preferred isobutylene polymer being made by the process of the latter patent and the details of the method also being given in the text "Vinyl and Related Polymers" by Schildknecht, 1952, John Wiley, at pages 555–556. The molecular weight of the isobutylene polymer is in the range of 100,000–200,000.

Due to the presence of a major amount of cyclodiene resin, the physical properties of the mixture containing isobutylene polymer and ethylene polymer are completely different than that of a mixture which contains a major portion of isobutylene polymer.

In the 3-component composition of the type of the present invention containing polyisobutylene in major proportion, the mixture for use as a coating on metal behaves almost as a liquid even after the solvent has evaporated. There is substantially no stiffness to the film after solvent is evaporated, the film is highly tacky, extremely elastic being capable of stretching up to 20 times its length, and has very poor dimensional stability properties, although it does possess good adhesion to the underlying metal base.

In contrast, within the critical proportions of the components in accordance with the invention, with cyclodiene polymer in major proportion, the film properties which are achieved are completely different from that which would be achieved in the example above based on isobutylene polymer in major proportion or that based upon polyethylene in major proportion. Polyethylene used is of average lower molecular weight than used as coating grade for best physical properties, e.g., for maximum elasticity, strength, impact, hardness and tear resistance. The cyclodiene polymer by itself resembles vulcanized linseed oil and is devoid of reactive carbon-to-carbon double bonds which characterize the synthetic drying oils as well as linseed oil.

Vulcanized linseed oil, known as factice, is notoriously poor in its film characteristics, e.g., it crumbles readily, has poor adhesion and has none of the desirable attributes to make it suitable in commerce as the tenacious coating for metal. The cyclodiene resin is, to a certain extent, similar to the vulcanized linseed oil in respect to its absence of unsaturation, indicating low chemical reactivity; and its hardness and lack of tenacity to metal, indicating its unsuitability for general coating use and its insufficient tensile strength and toughness.

One would not expect that the cyclodiene resin could be usable in physical admixture, but rather that it would require chemical modification to introduce softening characteristics and tensile strength improving characteristics based upon the chemical introduction of polar groups, such as was successfully carried out in the development of chlorosulfonated polyethylene to produce vulcanizable coatings for metal. It is surprising to discover, as applicant has done, that low molecular weight polyethylene which is a type of coating material not generally found suitable for achieving desired toughness and strength, can be blended with polyisobutylene, a notoriously poor coating material because of its lack of dimensional stability, to convert cyclodiene resin, a relatively intractible high melting material of poor physical properties for coating application, into an outstanding material for coating application and for chemical resistance to the action of acids and oxidizing agents.

In the examples of the preferred compositions in the invention, which are set forth in Table 1 herein, a large number of coatings were made to expose the underlying metal to the etching actions of all of the different mineral acids and oxidizing agents used in the manufacture of printed circuits and in the various types of chemical plating and electroplating operations. In every case, there was complete protection of the underlying metal surface in experiments which were conducted with iron, copper, brass, nickel, chromium and gold, silver, platinum, etc. In no instance was there found any deterioration of the coating which is completely resistant to all of the acids and oxidizing agents used, even up to temperatures of about 80° C. in the electrolytic or chemical coating bath. In addition to the resistance to such mineral acids as chromic, phosphoric, sulfuric, nitric, perchloric and hydrochloric acids, there is equally good resistance to boric acid, oxalic acid, sulfoxylates, etc. among the organic acids, and to oxidizing agents such as potassium permanganate, sodium perborate, sodium dichromate, hydrogen peroxide and sodium persulfate, all of these in acid solutions.

In the application of the coating for use as a protective resist, the conventional silk-screen and stencilling methods which are employed in the art are preferred. In contrast to objectionable flow at 5 mil coating weight using polyisobutylene, the present composition of the invention as in Table 1 exhibits no flow on the metal after depositing. As a result, the printed or etched circuit areas can be very accurately predetermined. Handling of the circuit element between chemical processing stages presents none of the problems had with the conventional synthetic resins which have been employed heretofore. In electroplating or electroless chemical baths containing a high percentage of strong alkali in water and used at elevated temperature, there is no impairment of film integrity and no discoloration, while in the case of vinyl resins or alkyd resins these resist coatings are saponified, dehydrohalogenated and frequently oxidized following the dehydrohalogenation at the reactive double bond created thereby to result in film porosity and underfilm corrosion. None of these defects are had with the coating of the invention which has had outstanding success in the gold and silver plating of printed circuits.

The present coatings may be applied by roller coating, dipping, spraying, brushing, calendering, wiping or other conventional techniques. The solvent medium evaporates quickly and evaporation can be hastened by subjecting to forced air drying at room or elevated temperatures. There is no sloughing away of the coating which is observed with substantially all of the asphalt products; and by means of the present invention, positive assurance is had that the chemical baths will never be polluted by the resist coating and the technician need never worry about the length of time the resist has been exposed to the acid, alkali or oxidizer in the liquid treating bath.

Remarkably, the cost of the present mask in gold or nickel plating operations is less than the cost of the suitable conventional asphalt products. The absence of ester groups and halogen groups in the resin molecule are believed to be tied up with the outstanding chemical resistance and physical properties which have been observed. The absence of liquid chemical plasticizers eliminates the tendency of the coating to sweat. The avoidance of special or expensive solvents contributes to economy and safety, the latter a real problem where vinyl resins are used because of the explosion hazard. Chemical and electrochemical plating produce pure products of superior structure at lower cost without departing in any way from the time honored simple procedures used in the art. These advantages carry over with equal benefit to the more complicated methods now employed.

While the invention has been particularly described with reference to preferred embodiments thereof, it will be understood by those skilled in the art that various changes in form and details may be made therein without departing from the spirit and scope of the invention.

What is claimed is:

1. A chemically-resistant, non-porous, non-conductive composition consisting essentially of from about 10% to about 35% of polymerized isobutylene of molecular weight varying from about 100,000 to 200,000, about 15% to about 40% of low molecular weight polyethylene of molecular weight varying from about 3,500 to about 22,000 and from about 50% to about 65% of cyclopentadiene dimer which has been polymerized with Friedel-Crafts catalyst to have a softening point between 95°–105° C.

2. A metal base for use in a printed circuit coated with a chemically-resistant, non-porous, non-conductive composition consisting essentially of from about 10% to about 35% of polymerized isobutylene of molecular weight varying from about 100,000 to 200,000, about 15% to about 40% of low molecular weight polyethylene of molecular weight varying from about 3,500 to about 22,000 and from about 50% to about 65% of cyclopentadiene dimer which has been polymerized with Friedel-Crafts catalyst to have a softening point between 95°–105° C.

3. A solvent solution of a chemically-resistant, non-porous, non-conductive composition which is dissolved in a hydrocarbon solvent containing a substantial proportion of high-flash naphtha having a distillation range of between about 148° C. and 190° C., said composition consisting essentially of from about 10% to about 35% of polymerized isobutylene of molecular weight varying from about 100,000 to 200,000, about 15% to about 40% of low molecular weight polyethylene of molecular weight varying from about 3,500 to about 22,000 and from about 50% to about 65% of cyclopentadiene dimer which has been polymerized with Friedel-Crafts catalyst to have a softening point between 95°–105° C.

4. A solvent solution as claimed in claim 3 wherein said solvent contains a major proportion of liquid polynuclear hydrocarbons.

5. A solvent solution of a chemically-resistant, protective masking, non-conductive and non-porous resist composition as claimed in claim 3 in which the composition consists of 55–60% of cyclodiene polymer, 12–24% of isobutylene polymer, and 19–33% of polyethylene and is dissolved in a volatile hydrocarbon solvent, 30–40% of said solvent having a distillation range below 160° C.

No references cited.